United States Patent
Yokoi

(10) Patent No.: US 7,919,803 B2
(45) Date of Patent: Apr. 5, 2011

(54) SEMICONDUCTOR MEMORY DEVICE HAVING A CAPACITOR STRUCTURE WITH A DESIRED CAPACITANCE AND MANUFACTURING METHOD THEREFOR

(75) Inventor: Naoki Yokoi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 8 days.

(21) Appl. No.: 12/234,060

(22) Filed: Sep. 19, 2008

(65) Prior Publication Data
US 2009/0078981 A1 Mar. 26, 2009

(30) Foreign Application Priority Data
Sep. 20, 2007 (JP) ................................. 2007-243747

(51) Int. Cl.
*H01L 29/94* (2006.01)
*H01L 29/00* (2006.01)
*H01L 21/20* (2006.01)

(52) U.S. Cl. ........ 257/306; 257/307; 257/308; 257/309; 257/528; 257/E23.142; 438/396

(58) Field of Classification Search .......... 257/306–309, 257/E23.144
See application file for complete search history.

(56) References Cited

U.S. PATENT DOCUMENTS
2001/0002710 A1* 6/2001 Roberts et al. ................. 257/306
2005/0145917 A1* 7/2005 Takeuchi et al. .............. 257/306

FOREIGN PATENT DOCUMENTS
JP 2000-156479 6/2000
JP 2003-197771 7/2003
JP 2003-234245 8/2003
JP 2003234245 A * 8/2003

* cited by examiner

*Primary Examiner* — Marcos D Pizarro
*Assistant Examiner* — Raj Gupta
(74) *Attorney, Agent, or Firm* — Scully, Scott, Murphy and Presser, P.C.

(57) ABSTRACT

A semiconductor memory device in which a plurality of capacitors each including a columnar lower electrode, a capacitor insulation film and an upper electrode are stacked with interlayer films therebetween, a contact plug connects an upper face of each lower electrode of a lower layer with a bottom face of each lower electrode of an upper layer, and another contact plug connects upper electrodes of the capacitors in respective layers with each other.

17 Claims, 9 Drawing Sheets

SEMICONDUCTOR MEMORY DEVICE HAVING A CAPACITOR STRUCTURE WITH A DESIRED CAPACITANCE AND MANUFACTURING METHOD THEREFOR

BACKGROUND OF THE INVENTION

1. Field of the Invention

The present invention relates to a semiconductor memory device and a manufacturing method therefor, and more particularly to a structure of a capacitor with a desired capacitance on a miniaturized memory cell and a manufacturing method therefor.

2. Description of Related Art

In a semiconductor memory device (Dynamic Random Access Memory, hereinafter referred to as "DRAM") which allows writing and reading as needed, one capacitor is connected with one transistor to retain charges. With recent technological development, there has become commercially practical a semiconductor memory device using a capacitor of a three-dimensional structure, among semiconductor memory devices such as, especially, a DRAM. For example, a conventional semiconductor memory device illustrated in FIGS. 11 and 12 of Japanese Patent Application Laid-Open No. 2000-156479 uses a cylindrical-type capacitor structure. For high integration degree, the conventional semiconductor memory device increases height size for required storage capacitance while reducing the occupying area of capacitors, using capacitors of such a three-dimensional structure.

Japanese Patent Application Laid-Open No. 2003-197771 has disclosed a capacitor structure obtainable of forming a lower electrode including a columnar portion, a sleeve portion isolatingly formed outside the columnar portion, and a connection portion for connecting the columnar portion lower end with the sleeve portion lower end, and then forming an upper electrode through a capacitor dielectric. This configuration provides a semiconductor device of a smaller cell area than the conventional one and a stable capacitor structure.

Japanese Patent Application Laid-Open No. 2003-234245 has disclosed capacitors of multilayer structure which has attained miniaturization and high capacitance. In the multilayer structure, a plurality of electrode layers forming a first electrode and a plurality of electrode layers forming a second electrode are alternately laminated via a dielectric layer by a thin film forming technique and the electrode layers forming the first electrode are connected with each other at one end portion without dielectric layers and the electrode layers forming the second electrode are connected with each other at the other end portion to construct a capacitor.

With miniaturization of elements, capacitors with high aspect ratio such as cylinder type, crown type or pillar type capacitors have been used. However, further development of miniaturization requires formation of a capacitor with desired capacitance on a memory cell of smaller size and therefore the mechanical strength of such a structure will be lowered and the difficulty in performing microfabrication such as dry etching has become high and hence it has become difficult to ensure a sufficient storage capacitance.

In the method of Japanese Patent Application Laid-Open No. 2003-197771, it will be caused a problem on the strength of a sleeve portion like a crown-type capacitor with further miniaturization. Japanese Patent Application Laid-Open No. 2003-234245 has not made effective use of height direction nor provided reduction of the area enough to be connected to a fine DRAM cell transistor, thus causing a problem with insufficient element miniaturization.

Furthermore, a DRAM requires formation of a peripheral circuit region as well as a memory cell region in which cell transistors are formed in an array manner. With higher miniaturization of the memory cell region, process sharing with the peripheral circuit region has become difficult more and more.

Accordingly, there has been demanded a semiconductor device with capacitors which have excellent mechanical strength and are easy to microfabricate even as element miniaturization has become higher and ensure sufficient storage capacitance.

Further, there has been demanded a semiconductor device which can share processes for forming various types of components in the peripheral circuit region and components in the memory cell region to solve the foregoing problems.

SUMMARY

The present invention seeks to solve one or more of the above problems, or to improve upon those problems at least in part.

In one embodiment, there is provided a semiconductor memory device that includes: a plurality of capacitor each including a columnar lower electrode and an upper electrode with which the lower electrode is covered through a capacitor insulation film, the capacitors being stacked with interlayer films therebetween; contacts each connecting an upper face of the lower electrode of each of the capacitors in a lower layer with a bottom face of the lower electrode of each of the capacitors in an upper layer; and a contact connecting the upper electrodes of the capacitors in respective layers with each other.

In another embodiment, there is provided a semiconductor memory device that includes:

a MOS transistor for memory cell;

a first electrode connected to a source or drain region of the MOS transistor;

a second electrode disposed facing to the first electrode with an intervention of a first insulating film therebetween;

a third electrode disposed above the first and second electrodes, connected to the first electrode;

a fourth electrode disposed facing to the third electrode with an intervention of a second insulating film therebetween; and a first contact plug connecting between the second and fourth electrodes, wherein the first, second, third, and fourth electrodes operate as a capacitor.

In further another embodiment, there is provided a method for manufacturing a semiconductor memory device that includes:

forming a capacitor in one layer by:

(1) forming an interlayer insulation film on a semiconductor substrate including a cell transistor and a contact plug connected with the semiconductor substrate;

(2) forming a first etching stopper layer and a first capacitor interlayer insulation film;

(3) forming a first opening for forming a first capacitor lower electrode connected to the contact plug in the first etching stopper layer and the first capacitor interlayer insulation film;

(4) forming a first capacitor lower electrode at the first opening;

(5) removing the first capacitor interlayer insulation film around the first capacitor lower electrode and forming a first capacitor insulation film and a first capacitor upper electrode;

(6) forming a first capacitor upper interlayer insulation film over the whole surface;

(7) forming a second opening for exposing an upper end of the first capacitor lower electrode in the first capacitor upper interlayer insulation film; and (8) forming a side wall insulation film on a second opening side wall and forming a contact plug connected to the upper end of the first capacitor lower electrode; and repeating the above (2) to (8) by a predetermined number of times and layering a plurality of capacitors.

A first advantage is that microfabrication such as dry etching becomes easier because an aspect ratio of capacitors in respective layers can be kept low and large capacity of capacitors can be obtained according to a simple manufacturing method because capacitor electrodes can be restrained from being broken. Thus, a DRAM with high integration degree beyond the conventional limit of microfabrication can be attained.

A second advantage is that a refresh cycle of a DRAM can grow longer to reduce power consumption because capacitors having great capacitance can be easily formed by stacking capacitor layers as required. Specifically, by increasing the charge quantity capable of being retained in a capacitor, the number of refreshing operations of a DRAM performed within a certain period of time can be decreased and therefore the transistor power consumption of the peripheral circuit portion required for refreshing operation can be reduced.

A third advantage is that upper electrode material, lower electrode material of capacitors in respective layers or both thereof can be used as individual wiring layer material in the peripheral circuit region. Accordingly, in the peripheral circuit region, flexibility of wiring layer layout increases and therefore integration degree can be increased more easily. Hence, a semiconductor chip of small size can be manufactured more easily.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

First Exemplary Embodiment

Figure 1:
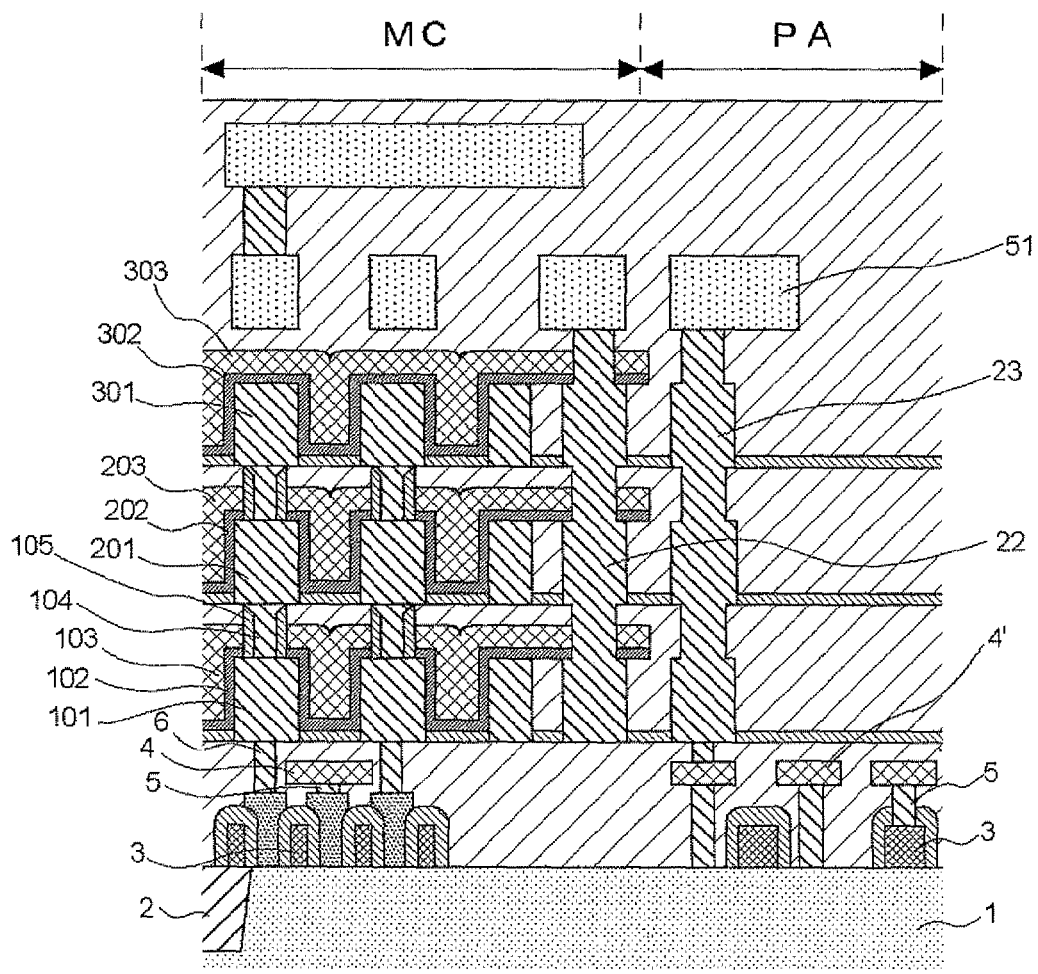
FIG. 1 is a sectional schematic view of a DRAM as a first embodiment.

FIG. 1 illustrates a sectional schematic view of a DRAM as a first exemplary embodiment of the present invention. In FIG. 1, memory cell area (MC) is illustrated on the left side and a peripheral circuit area (PA) is illustrated on the right side.

In the same way as a conventional DRAM, on silicon substrate 1, there are provided element isolation region 2, a gate insulation film (not illustrated because of small thickness) of a MOS (Metal-Oxide-Semiconductor) transistor, gate electrode (word line) 3, bit line 4 and contact plug 5 for interconnecting thereof. Bit line 4 functions as a wiring layer for connecting respective transistors in the peripheral circuit region.

In the memory cell area, cylindrical or prismatic first capacitor lower electrodes 101 are provided so as to be connected to silicon substrate 1 through contact plug 6. The surface of each of lower electrodes 101 is covered with first capacitor insulation film 102 and further first upper electrode 103 is formed on first capacitor insulation film 102. Thus, a first layer of capacitors are constructed.

To an upper face of first lower electrode 101, second lower electrode 201 of the same structure as the first lower electrode is connected through contact plug 104.

Contact plug 104 is isolated from first capacitor insulation film 102 and first upper electrode 103 by insulative side wall 105.

On second lower electrode 201, second capacitor insulation film 202 and second upper electrode 203 are formed in the same way as first lower electrode 101, and a second layer of capacitor arranged coaxially to the first layer of capacitor is constructed.

In addition, first upper electrode 103 and second upper electrode 203 are connected to each other by contact plug 22, thereby electrically connecting the first layer of capacitor and the second layer of capacitor to each other in parallel. On the second layer of capacitor, a third layer of capacitor is formed in the same way as the above.

In the peripheral circuit region, wiring layer 4' formed in the same process as bit line 4 and metal wiring 51 at a first layer are connected to each other by contact plug 23.

Such a configuration allows the capacitance of capacitors connected to respective cell transistors to become a total sum of capacitances of capacitors in respective layers and therefore large capacitance can be ensured as the whole even if the capacitances of capacitors at individual layers are small.

In FIG. 1, three layers of capacitors are coaxially arranged, but a configuration of two layers or four or more layers may be used, depending upon required capacitance.

Referring next to FIGS. 2 to 16, a manufacturing method of the first exemplary embodiment will be described below.

In the same way as FIG. 1, the memory cell area (MC) is illustrated on the left side and the peripheral circuit area (PA) is illustrated on the right side.

In the memory cell area and peripheral circuit area, contact plugs and wiring layers formed in the same process have the same reference numerals/characters.

Figure 2:
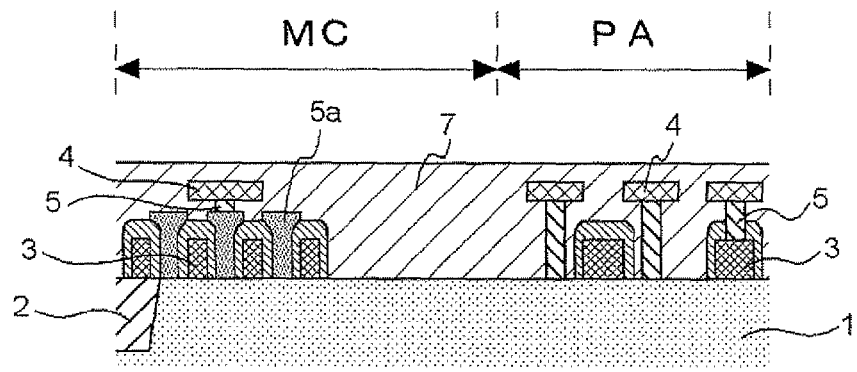
FIGS. 2 to 16 are a cross-sectional process view illustrating a manufacturing process of a first exemplary embodiment, respectively.

First, as illustrated in FIG. 2, on silicon substrate 1, there are provided element isolation region 2, a gate insulation film (not illustrated because of small thickness) of a MOS transistor, gate electrode (word line) 3, bit line 4 and contact plug 5 for interconnecting thereof. In the memory cell area, on a source-drain region of a MOS transistor, there is provided contact plug 5a at the lower layer formed of single-crystal silicon or polysilicon. Contact plug 5 and bit line 4 are provided on contact plug 5a at the lower layer. In addition, a portion between elements thereof is filled with interlayer insulation film 7 formed of an insulation film such as silicon dioxide film or silicon nitride film, and the two thereof are isolated from each other.

Figure 3:
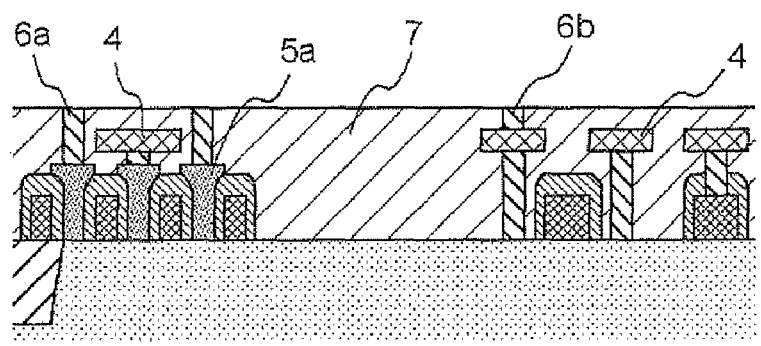

Next, as illustrated in FIG. 3, after an opening is formed in interlayer insulation film 7 by photolithography and dry etching techniques and a conductive film is deposited over the whole surface in the order of titanium nitride and tungsten by PVD (Physical Vapor Deposition) method, excess titanium nitride and tungsten are removed by CMP (Chemical Mechanical Polishing) method or dry etching technique.

Thus, contact plugs 6a and 6b constructed of a conductive film are formed at the opening.

Contact plug 6a is provided to be connected to contact plug 5a at the lower layer. Contact plug 6b is provided to be connected to wiring layer 4 formed in the same process as bit line 4 at the peripheral circuit area.

Figure 4:
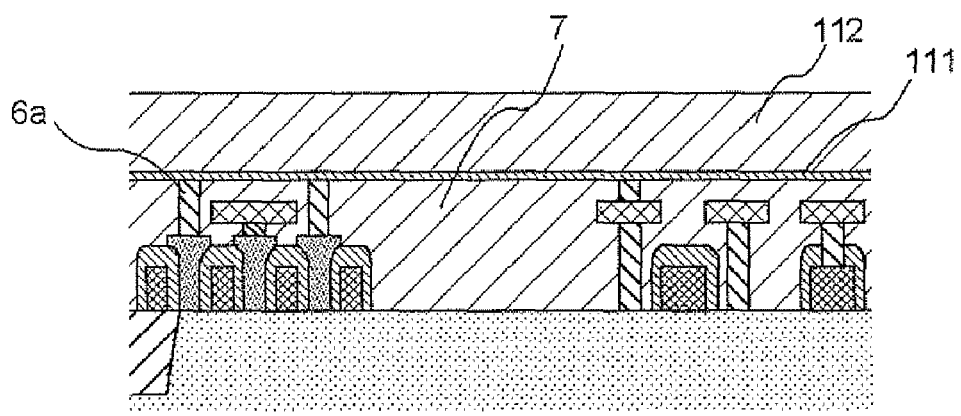

Next, as illustrated in FIG. 4, first etch stopper layer 111 constructed of a silicon nitride film and first capacitor interlayer insulation film 112 constructed of a silicon dioxide film are deposited over the whole surface by the CVD (Chemical Vapor Deposition) method.

Figure 5:
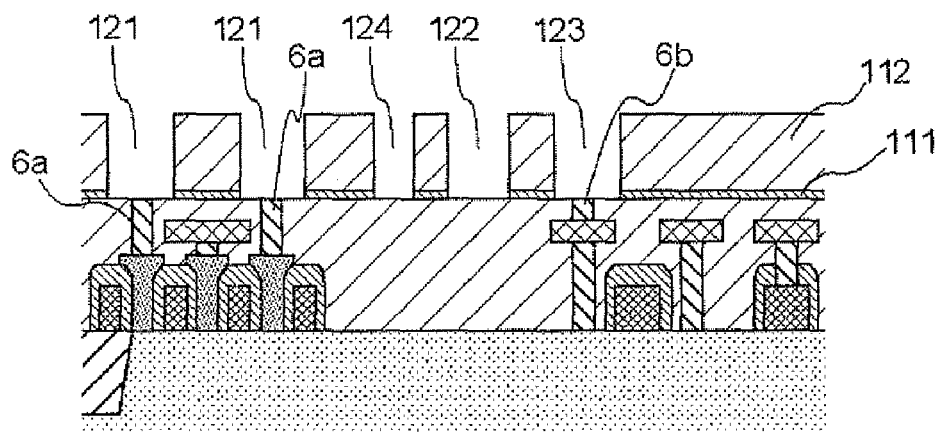

Next, as illustrated in FIG. 5, openings are formed in first capacitor interlayer insulation film 112 and first etch stopper layer 111 by photolithography and dry etching techniques.

The openings are cylindrical or prismatic opening 121 formed to be connected with contact plug 6a in a memory cell portion, cylindrical or prismatic opening 122 formed on interlayer insulation film 7, cylindrical or prismatic opening 123 formed to be connected with contact plug 6b in the peripheral circuit area, and opening 124 formed to surround the memory cell portion and formed with a guard ring functioning as a stopper of wet etching in the subsequent process.

Figure 6:
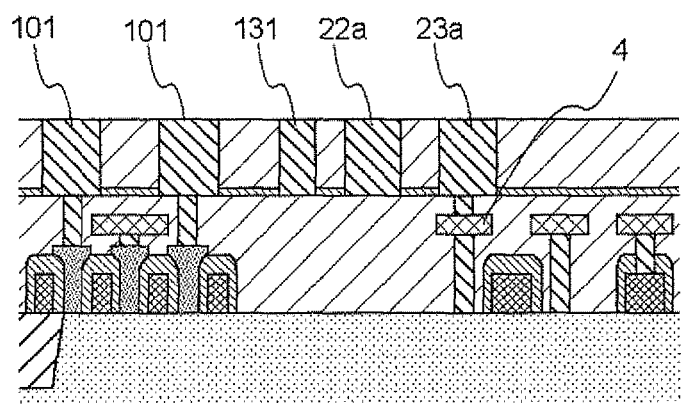

Next, as illustrated in FIG. 6, titanium nitride is deposited over the whole surface by the CVD method or the like and excess titanium nitride is removed by CMP method or dry etching technique so that only the openings in FIG. 5 are filled with titanium nitride. Accordingly, opening 121 in FIG. 5 is formed with lower electrode 101 of a capacitor of the first layer, opening 122 in FIG. 5 is formed with part plug 22a of contact plugs 22 interconnecting respective upper electrodes of capacitors to be stacked with metal wiring (not illustrated because of not formation yet) of the first layer, opening 123 in FIG. 5 is formed with part plug 23a of contact plugs 23 interconnecting bit line 4 with metal wiring (similarly, not illustrated) of the first layer, and opening 124 in FIG. 5 is formed with guard ring 131 of the first layer as a stopper for wet etching in the subsequent process, respectively.

Figure 7:
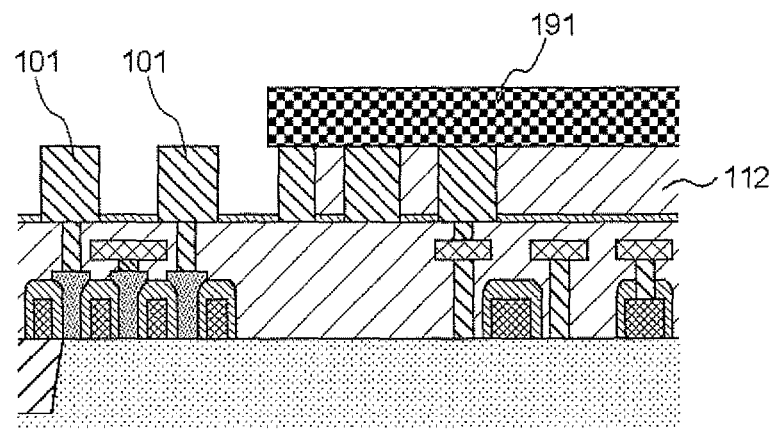

Next, as illustrated in FIG. 7, photo resist pattern 191 with only the memory cell portion open is formed by photolithography technique. With the pattern as a mask, first capacitor interlayer insulation film 112 is subjected to wet etching using chemical solution containing hydrogen fluoride to expose capacitor lower electrode 101 in the first layer.

The memory cell portion is surrounded by guard ring 131 and etch stopper layer (silicon nitride film) 111 and therefore wet etching does not reach the peripheral circuit portion.

Subsequently, photo resist pattern 191 is removed by plasma ashing.

Figure 8:
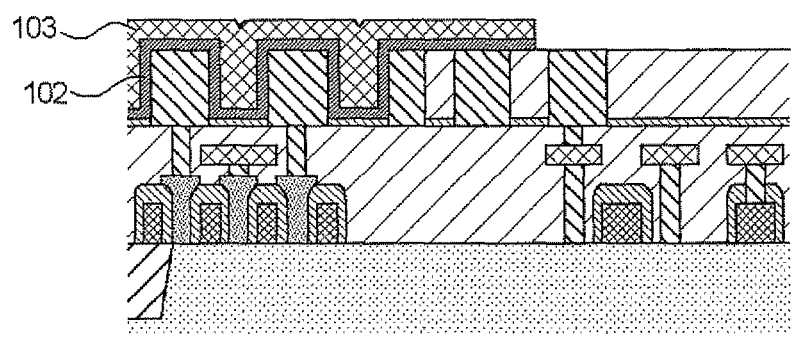

Next, as illustrated in FIG. 8, after first capacitor insulation film 102 made of aluminum oxide or the like is deposited by the CVD method and a metal film is deposited in the order of titanium nitride and tungsten by the CVD method or the like to form first capacitor upper electrode 103, first capacitor upper electrode 103 and first capacitor insulation film 102 are patterned by photolithography and dry etching techniques.

Figure 9:
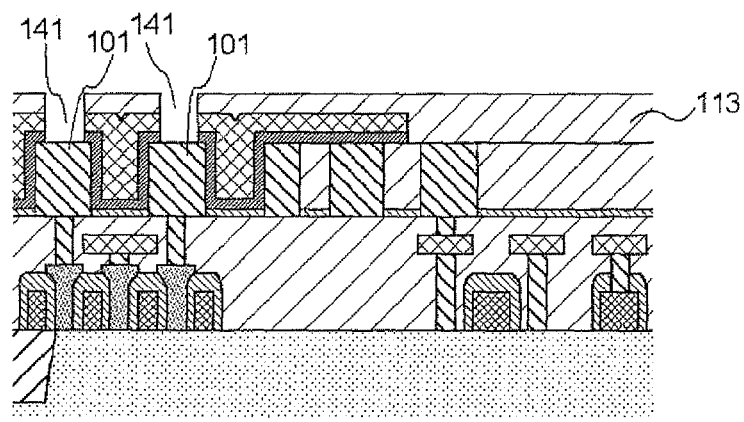

Next, as illustrated in FIG. 9, after first capacitor upper interlayer insulation film 113 made of a silicon dioxide film is deposited by the CVD method and is flattened by the CMP method, cylindrical or prismatic opening 141 is formed on first capacitor lower electrode 141 by photolithography and dry etching techniques.

Figure 10:
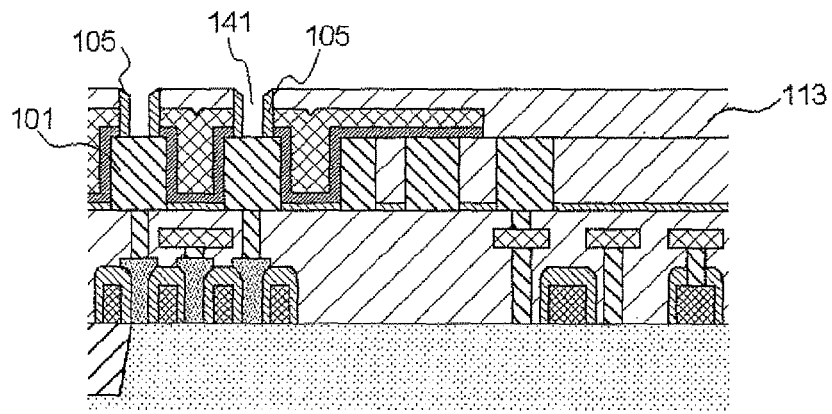

Next, as illustrated in FIG. 10, after a silicon nitride film is deposited over the whole surface by the CVD method, the film is etched back by dry etching to form side wall 105 made of a silicon nitride film in opening 141.

Figure 11:
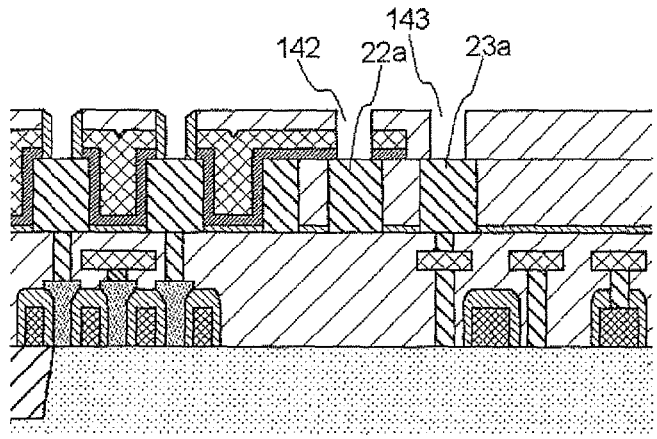

Next, as illustrated in FIG. 11, cylindrical or prismatic openings 142 and 143 are provided on part plugs 22a and 23a, respectively, by photolithography and dry etching techniques.

Figure 12:
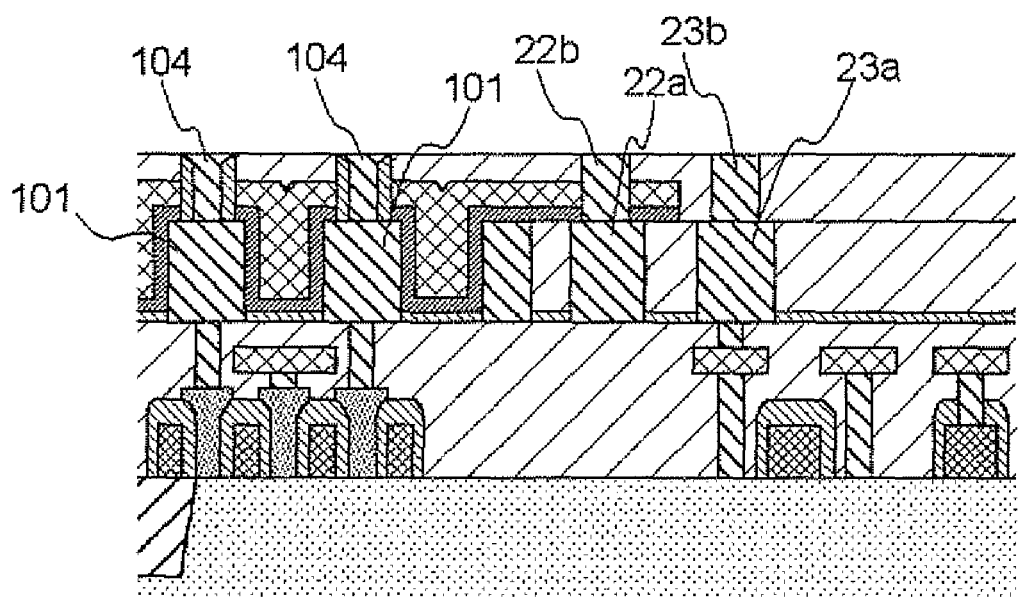

Next, as illustrated in FIG. 12, titanium nitride is deposited over the whole surface by the CVD method or the like and excess titanium nitride is removed by CMP or dry etching. Then, on the first capacitor lower electrode, contact plug 104 is formed and, on part plugs 22a and 23a, other part plugs 22b and 23b of the contact plugs are formed, respectively.

Figure 13:
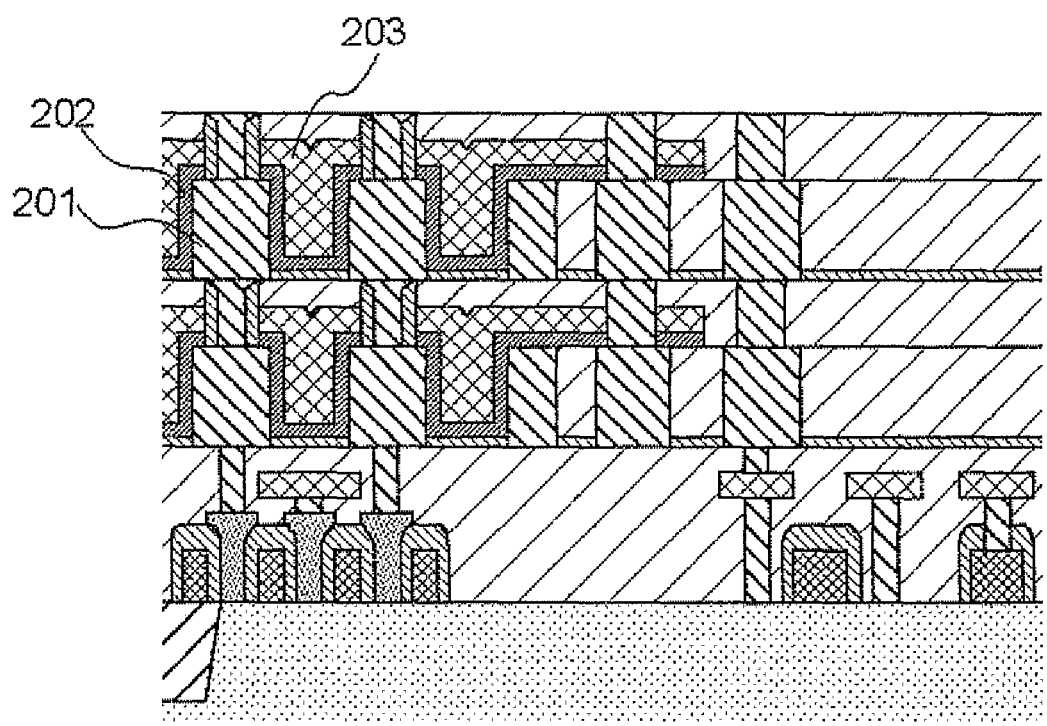

Next, as illustrated in FIG. 13, processes illustrated in FIGS. 4 to 12 are repeated to stack the same structure on top of each other in layers. A photomask used in each photolithography process is the same as those used in photolithography process described in FIGS. 4 to 12.

The number of repetitions may be twice or more and, in the case of two capacitor layers, repetition is not required.

Figure 14:
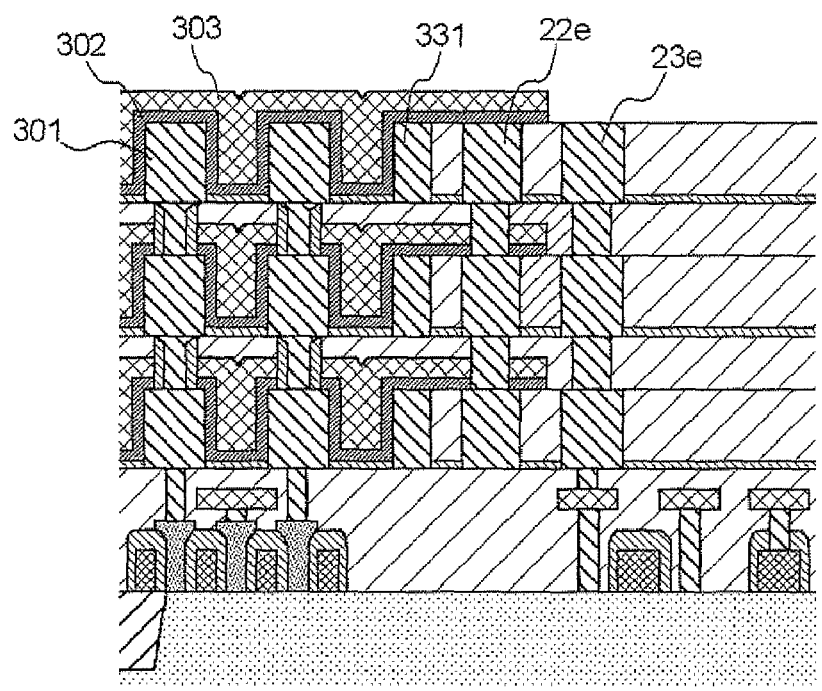

Next, as illustrated in FIG. 14, the processes illustrated in FIGS. 4 to 8 are repeated to form third capacitor lower electrode 301, third capacitor insulation film 302, third capacitor upper electrode 303, guard ring 331, part plug 22e of contact plug 22 and part plug 23e of contact plug 23. At this time, even in each photolithography process, the same photo mask as those used in the respective photolithography processes described in FIGS. 4 to 8 is used.

Figure 15:
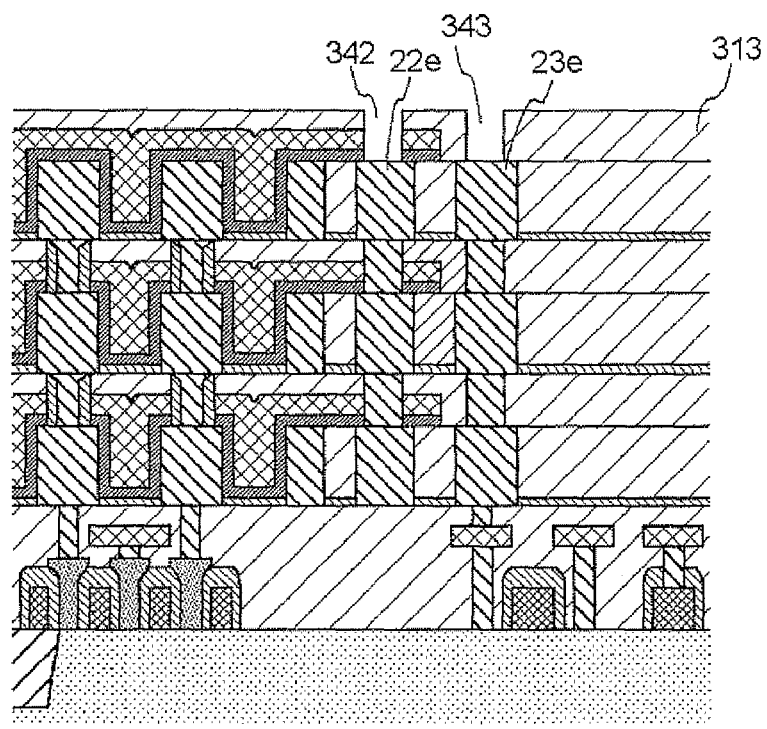

Next, as illustrated in FIG. 15, after capacitor upper interlayer insulation film 313 at the uppermost layer made of a silicon oxide film is deposited by the CVD method and is flattened by CMP, cylindrical or prismatic opening 342 is formed on part plug 22e of contact plug 22 and cylindrical or prismatic opening 343 is formed on part plug 23e of contact plug 23, respectively.

Figure 16:
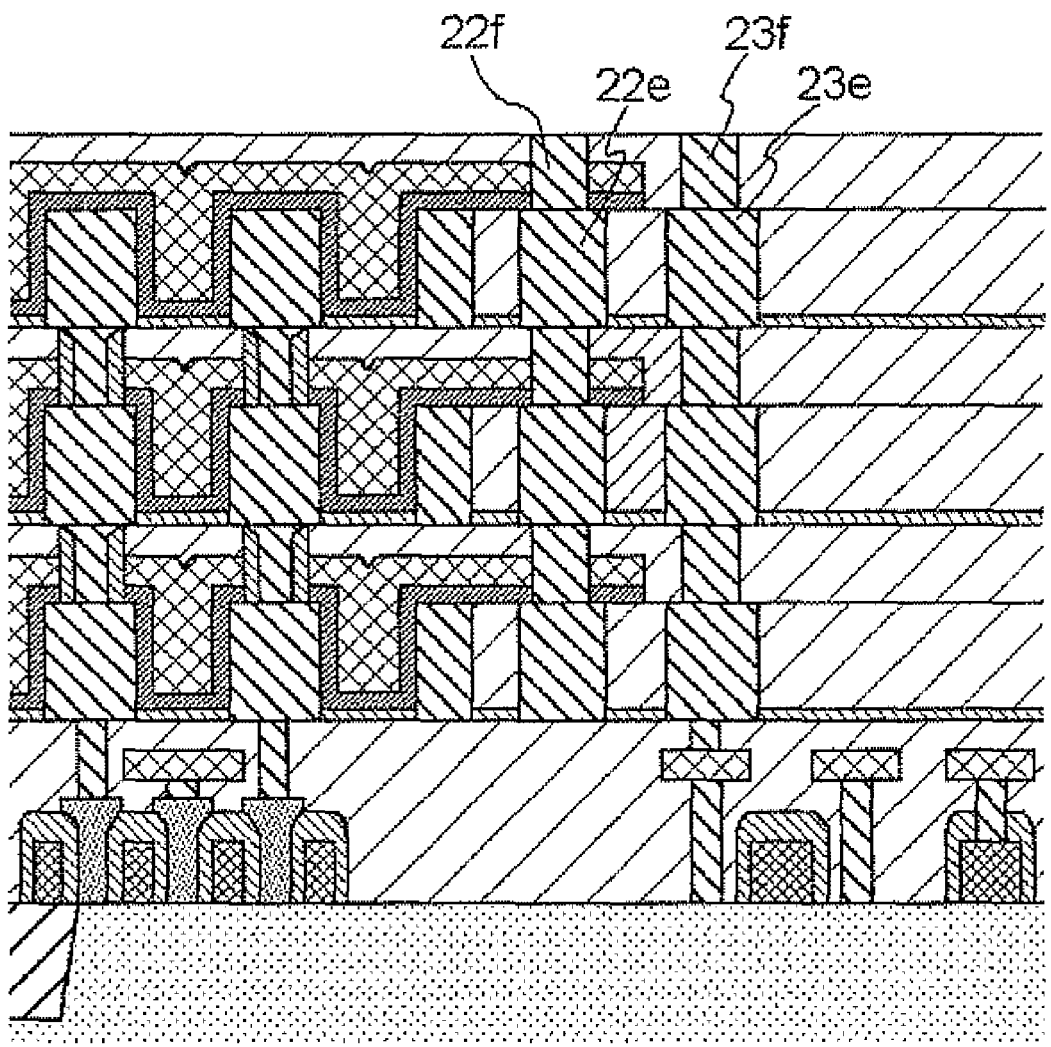

Next, as illustrated in FIG. 16, on part plugs 22e and 23e of the contact plugs, other part plugs 2f, 23f of the contact plugs are formed, respectively, in the same way as in FIG. 12.

Finally, by providing a contact plug for interconnecting metal wiring 51 at the first layer such as aluminum or copper, a metal wiring on a further upper layer and metal wirings at the respective layers in the same way as for conventional DRAM manufacture, such a structure as illustrated in the sectional schematic view of FIG. 1 is obtained.

Second Exemplary Embodiment

In the first exemplary embodiment described above, an upper electrode and a contact plug may be formed for each capacitor layer, using a specific photo mask. Accordingly, a local wiring is formed between capacitor upper electrodes in respective layers and a contact plug allows the local wirings to be connected with each other and therefore multilayering of local wirings can be achieved.

Figure 17:
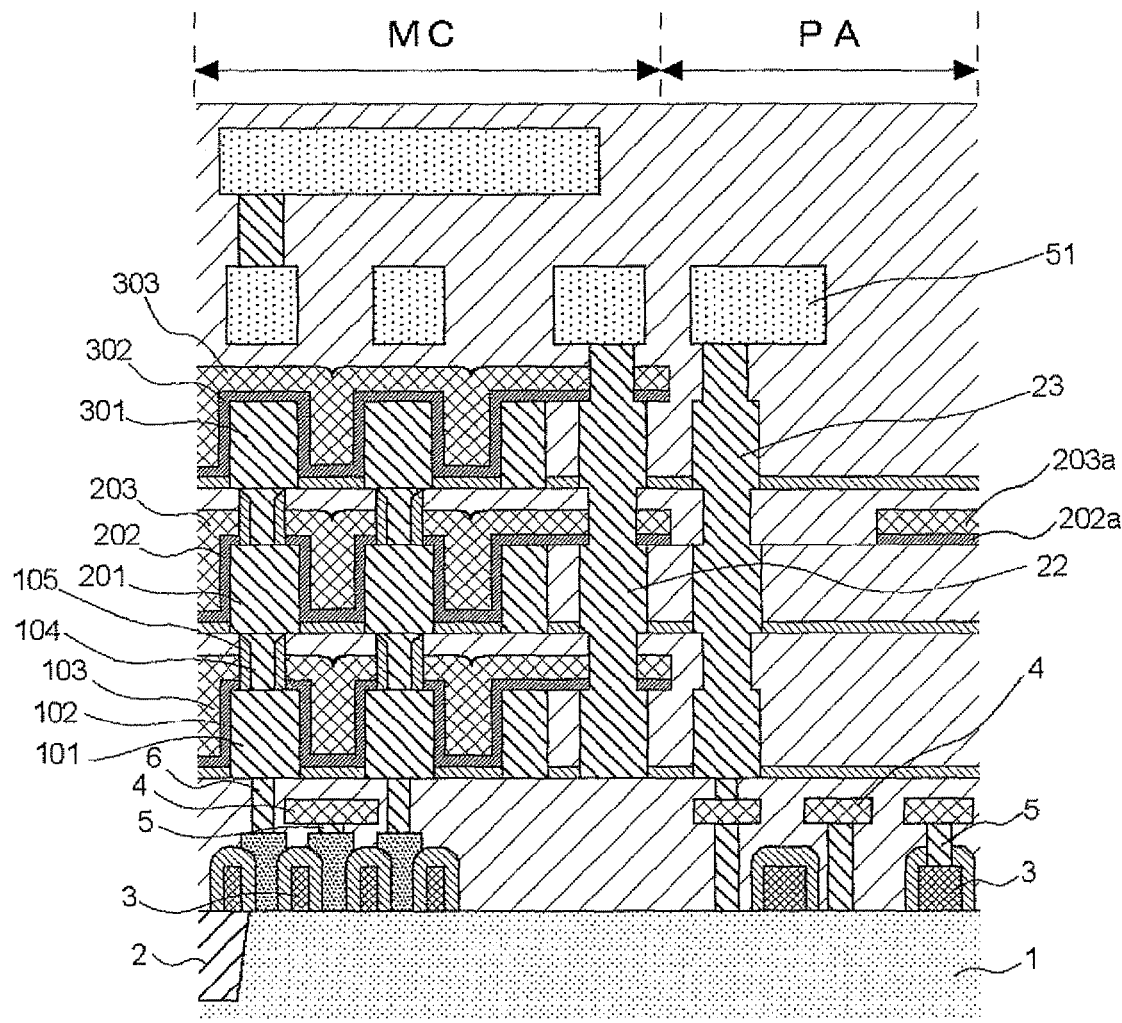
FIG. 17 is a sectional schematic view of a DRAM as a second exemplary embodiment.

FIG. 17 illustrates a sectional view of wiring layer 203a formed in the peripheral circuit area (PA) using the same layer as upper electrode 203 at the second layer from the bottom.

Capacitor insulation film 202 is patterned in the same way and is left as 202a under wiring layer 203a, but no particular problems occur. For connection of wiring layer 203a with another wiring positioned at the upper or lower layer, a contact plug may be provided as needed. Accordingly, in a peripheral circuit area, the same layer as the upper electrode of a capacitor at each layer can be used as a local wiring layer, thus increasing flexibility of wiring layout, which can increase an occupying rate of a memory cell in a DRAM chip and further reducing the size of the chip.

Third Exemplary Embodiment

In the first exemplary embodiment described above, a contact plug portion may be formed into a dual damascene structure using a specific photo mask for each capacitor layer. In the second exemplary embodiment described above, the same layer as an upper electrode of each capacitor has been used as a local wiring layer. On the other hand, in the present embodiment, a wiring layer is formed in the same layer as the lower electrode. Specifically, in the peripheral circuit area, a groove pattern for wiring is formed at the same time when an opening for embedding a lower electrode is formed. Furthermore, in the peripheral circuit area, a contact hole for connecting the local wiring with the lower wiring layer is formed using the dual damascene method. Subsequently, by burying a conductor for a lower electrode of a capacitor, a local wiring layer for a peripheral circuit area and a contact plug can be formed at the same time.

Figure 18:
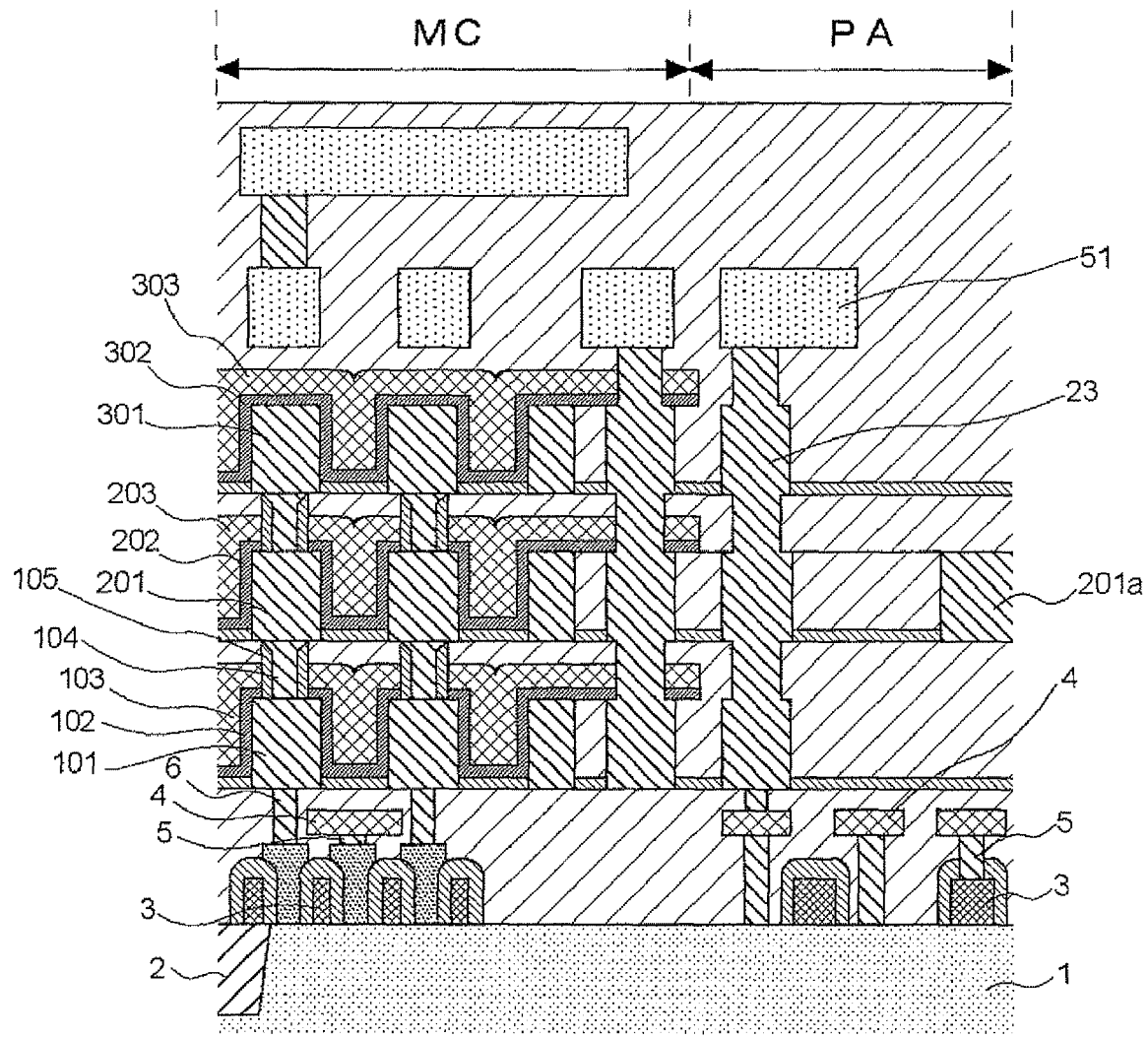
FIG. 18 is a sectional schematic view of a DRAM as a third exemplary embodiment.

FIG. 18 illustrates a sectional view in which wiring layer 201a is formed in the peripheral circuit area (PA) using the same layer as lower electrode 201 at the second layer from the bottom (contact plug not illustrated). By using the lower electrode material as a local wiring in a peripheral circuit area in this way, flexibility of wiring layout can be increased and reduction of a chip dimension can be easily implemented.

In the respective embodiments described above, the lower or upper electrode of a capacitor may be formed of another conductive material such as polysilicon or tungsten. Alloy or laminated film constructed from a plurality of conductive materials may be also used.

Similarly, the capacitor insulation film may be formed of another insulation film such as hafnium oxide or zirconium oxide. A multilayered film formed of a plurality of materials may be also used.

A capacitor structure of the present invention is not limited to a memory cell of a DRAM and can be applied to a case where a large capacity of capacitors is formed in a limited bottom area.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor memory device, comprising:
    a plurality of capacitors each including a columnar lower electrode and an upper electrode with which an upper face and a side face of the lower electrode are covered with a capacitor insulation film therebetween, the capacitors being stacked with interlayer films therebetween;
    first contact plugs each connecting an upper face of the lower electrode of each of the capacitors in a lower layer with a bottom face of the lower electrode of each of the capacitors in an upper layer; and
    a second contact plug connecting the upper electrodes of the capacitors in respective layers with each other,
    wherein each of the first contact plugs is disposed between the upper face of each of the lower electrodes in the lower layer and a bottom face of each of the lower electrodes in the upper layer, and each of the first contact plugs penetrates the upper electrode over the upper face of each of the lower electrodes.

2. The semiconductor memory device according to claim 1, wherein a part of the second contact plug is formed of the same material as that of the lower electrodes of the capacitors in respective layers.

3. The semiconductor memory device according to claim 1, comprising a memory cell area in which the capacitors are formed and a peripheral circuit area, wherein at least one of the contact plugs in the peripheral circuit area is formed of the same material as that of the second contact plug connecting the upper electrodes of the capacitors in respective layers with each other.

4. The semiconductor memory device according to claim 1, comprising a memory cell area in which the capacitors are formed and a peripheral circuit area, wherein at least one of wirings in the peripheral circuit area is formed of the same material as that of the upper electrodes of the capacitors in any of respective layers.

5. The semiconductor memory device according to claim 1, comprising a memory cell area in which the capacitors are formed and a peripheral circuit area, wherein at least one of wirings in the peripheral circuit area is formed of the same material as that of the lower electrodes of the capacitors in any of respective layers.

6. The semiconductor memory device according to claim 1, further comprising: a plurality of side wall insulting films between a side face of each of the first contact plugs and a side face of each of the upper electrodes, the side face of each of the upper electrodes being opposed to the side face of each of the first contact plugs respectively.

7. The semiconductor memory device according to claim 1, wherein each of the first contact plugs penetrates the capacitor insulating film on the upper face of each of the lower electrodes.

8. The semiconductor memory device according to claim 1, wherein the second contact plug penetrates the upper electrode, a part of a side face of the second contact plug being in contact with each of the upper electrodes.

9. The semiconductor memory device according to claim 8, wherein the second contact plug penetrates the capacitor insulating film under each of the upper electrodes.

10. A semiconductor memory device comprising:
    a MOS transistor for memory cell;
    a first electrode connected to a source or drain region of the MOS transistor;
    a second electrode disposed facing to the first electrode with an intervention of a first insulating film therebetween;
    a third electrode disposed above the first and second electrodes, connected to the first electrode by a first contact plug;
    a fourth electrode disposed facing to the third electrode with an intervention of a second insulating film therebetween; and
    a second contact plug connecting between the second and fourth electrodes, wherein the first contact plug is disposed between an upper surface of the first electrode and a bottom surface of the third electrode, the first contact plug penetrating the second electrode, and the first, second, third, and fourth electrodes operating as a capacitor.

11. The semiconductor memory device according to claim 10, wherein the first contact plug is disposed in a contact hole penetrating the second electrode, the first contact plug is opposed to a side surface of the second electrode defining the contact hole with an intervention of a side wall insulting film therebetween.

12. The semiconductor memory device according to claim 10, wherein a etch stopper layer for exposing the first electrode by wet etching is disposed between the fourth and second electrodes.

13. The semiconductor memory device according to claim 10, further comprising:
    a peripheral circuit area; and
    a third contact plug at the peripheral circuit area, wherein the layer forming the first electrode includes a part of the third contact plug.

14. The semiconductor memory device according to claim 10, further comprising:
   a peripheral circuit area; and
   a third contact plug at the peripheral circuit area,
   wherein the layer forming the first contact plug includes a part of the third contact plug.

15. The semiconductor memory device according to claim 10, wherein the first contact plug penetrates the first insulating film on the first electrode.

16. The semiconductor memory device according to claim 15, wherein the second contact plug penetrates the first insulating film on the first electrode.

17. The semiconductor memory device according to claim 16, wherein the second contact plug penetrates the second electrode.

* * * * *